US009245321B2

(12) United States Patent
Park et al.

(10) Patent No.: US 9,245,321 B2
(45) Date of Patent: Jan. 26, 2016

(54) PARALLEL IMAGE RECONSTRUCTION USING FILTER BANKS BASED ON LOW-FREQUENCY PART OF K-SPACE SIGNALS

(71) Applicant: Korea Advanced Institute of Science and Technology, Daejeon (KR)

(72) Inventors: Hyun Wook Park, Daejeon (KR); Jun Young Chung, Incheon (KR); Dong Chan Kim, Daejeon (KR); Joon Sung Choi, Daejeon (KR); Ye Ji Han, Seoul (KR)

(73) Assignee: Korea Advanced Institute of Science and Technology (KR)

( * ) Notice: Subject to any disclaimer, the term of this patent is extended or adjusted under 35 U.S.C. 154(b) by 69 days.

(21) Appl. No.: 14/271,710

(22) Filed: May 7, 2014

(65) Prior Publication Data

US 2015/0117735 A1   Apr. 30, 2015

(30) Foreign Application Priority Data

Oct. 29, 2013 (KR) .......................... 10-2013-0129369

(51) Int. Cl.
*G06K 9/00* (2006.01)
*G01R 33/561* (2006.01)
*G06T 5/00* (2006.01)
*G06T 7/00* (2006.01)

(52) U.S. Cl.
CPC ............ *G06T 5/001* (2013.01); *G01R 33/5611* (2013.01); *G06T 7/0012* (2013.01)

(58) Field of Classification Search
CPC ........... G01R 33/5611; G01R 33/5612; G01R 33/561
See application file for complete search history.

(56) References Cited

U.S. PATENT DOCUMENTS

| 6,944,347 | B2 | 9/2005 | Lee et al. | |
|---|---|---|---|---|
| 2009/0134870 | A1* | 5/2009 | Jellus | G01R 33/5611 324/309 |
| 2009/0136104 | A1* | 5/2009 | Hajian | G01R 33/56 382/128 |
| 2011/0286648 | A1* | 11/2011 | Sharif | G01R 33/5611 382/131 |
| 2012/0074940 | A1* | 3/2012 | Kimura | A61B 5/055 324/314 |
| 2013/0301891 | A1* | 11/2013 | Hwang | G06T 11/005 382/131 |

\* cited by examiner

*Primary Examiner* — Avinash Yentrapati
(74) *Attorney, Agent, or Firm* — Harness, Dickey & Pierce, P.L.C.

(57) ABSTRACT

A method for a parallel image reconstruction is disclosed. The method includes (a) acquiring image information by channel via parallel coils in a magnetic resonance imaging (MRI) scanner; (b) extracting low-frequency signals from the image information; (c) reconstructing low-frequency images from the low-frequency signals; (d) generating filter banks by using the low-frequency images; and (f) reconstructing a final image by using the filter banks. The generating of the filter banks includes separately generating low-frequency image information for reconstruction of magnitude information and low-frequency image information for reconstruction of phase information, and then separately generating a filter for reconstruction of the magnitude information and a filter for reconstruction of the phase information.

10 Claims, 19 Drawing Sheets

PARALLEL IMAGE RECONSTRUCTION USING FILTER BANKS BASED ON LOW-FREQUENCY PART OF K-SPACE SIGNALS

RELATED APPLICATIONS

The present application is based on, and claims priority from, Korean Patent Application Number 10-2013-0129369, filed Oct. 29, 2013, the disclosure of which is hereby incorporated by reference herein in its entirety.

TECHNICAL FIELD

The present disclosure in some embodiments relates to a parallel image reconstruction for use in magnetic resonance image system.

BACKGROUND

The statements in this section merely provide background information related to the present disclosure and may not constitute prior art.

Parallel magnetic resonance imaging (pMRI) employs the following image reconstruction methods:
1. Simultaneous acquisition of spatial harmonics (SMASH)
2. Variable density-AUTO-SMASH (VD-AUTO-SMASH)
3. Generalized auto-calibrating partially parallel acquisitions (GRAPPA)
4. Multi-column multi-line GRAPPA: 2D-GRAPPA
5. Method and device for magnetic resonance imaging on the basis of a partially parallel acquisition (PPA).

SMASH is one of the methods for reconstructing images in k-space. SMASH acquires image information by performing sub-sampling in the $k_y$-direction in k-space in order to reduce image acquisition time.

In this case, image information that is acquired from each channel may be represented by Equation 1:

$$S(k_x, k_y) = \iint dxdy\, C_j(x,y)\rho(x,y)e^{-ik_x x - ik_y y} \quad \text{Equation 1}$$

In Equation 1, $C_j(x,y)$ is the sensitivity profile of a j-th channel, and $\rho(x,y)$ is overall image information to be reconstructed. Assuming that $C^{comp}$ is the sum of values obtained by multiplying the sensitivity profiles of respective channel images by a specific constant, a value $n_j$ that allows $C^{comp}$ to become spatial harmonics may be acquired, as indicated in Equation 2 (see FIG. 1), and the constant by which the sensitivity profiles of respective channels should be multiplied in order to form $C^{comp}$ is estimated using the sensitivity profiles of the respective channels images.

$$C^{comp}(x, y) = \sum_j n_j C_j(x, y) = \exp(im\Delta k_y y) \quad \text{Equation 2}$$

When the constant that allows spatial harmonics to be formed is obtained and then multiplied by the channel images, information on locations adjusted by +m or −m in the $k_y$-direction may be acquired, as indicated by Equation 3:

$$S(k_x, k_y + m) = \iint dxdy\, C^{comp}(x, y)\rho(x, y)\exp^{-ik_x x - ik_y y}$$

$$= \iint dxdy\, \rho(x, y)\exp^{-ik_x x - i(k_y + m\Delta k_y)y} \quad \text{Equation 3}$$

Unacquired information is estimated with value $n_j$ acquired using the sensitivity profiles, as described above, thereby reconstructing the overall image information.

While SMASH is the first proposed algorithm for generating harmonics by using individual sensitivity profiles in k-space and then reconstructing an image as described above, it has disadvantage that it requires sensitivity profiles to reconstruct an image and cannot compensate for image distortion attributable to interference between channels (see Sodickson, D. K. & Manning, W. J. 1997. Simultaneous Acquisition of Spatial Harmonics (SMASH): Fast Imaging Radiofrequency Coil Arrays. Magnetic Resonance in Medicine, 38(4), 591-603).

VD-AUTO-SMASH is an improvement on SMASH. In VD-AUTO-SMASH, the process of acquiring a constant used for image reconstruction by using sensitivity profiles in SMASH is replaced with the process of acquiring auto-calibrating signal (ACS) information and estimating a constant based on data. Although VD-AUTO-SMASH takes a longer image acquisition time than SMASH for acquiring a plurality of pieces of ACS information, a constant used to generate harmonics can be estimated with higher accuracy.

VD-AUTO-SMASH is an improvement on SMASH and AUTO-SMASH. Unlike SMASH, AUTO-SMASH and later methods acquire a coil-weighting factor through the process of acquiring ACS information and then fitting the ACS information to sub-sampled information, as in the second process of FIG. 2. The image information of an unacquired location is acquired using the constant value acquired by the fitting process. In this case, if m is the distance in the $k_y$-direction between the image information of an acquired part and image information to be acquired, that is, unacquired image information, the image information of an acquired part and the image information of the unacquired image information have a relationship formed via the coil-weighting factor and the sensitivity profile, as expressed by Equation 4:

$$S^{ACS}(k_x, k_y - m\Delta k_y) = \sum_j n_j^m S_j(k_x, k_y)$$

$$= \iint dxdy \sum_j n_j^m C_j(x, y)\rho(x, y)e^{-ik_x x - ik_y y}$$

$$= \iint dxdy \sum_j C^{comp}(x, y)\rho(x, y)e^{-ik_x x - ik_y y} \quad \text{Equation 4}$$

Value $n_j^m$ indicating the relationship between the ACS information and the acquired signal is obtained from Equation 4, and then an image is reconstructed using value $n_j^m$. Since VD-AUTO-SMASH uses a plurality of pieces of ACS information, the constant $n_j^m$ for each channel j and value m is acquired by the weighted sum of the plurality of constants acquired by the plurality of pieces of ACS information.

VD-AUTO-SMASH has the advantage of performing the process of acquiring sensitivity profiles based on data by introducing the concept of ACS information, and also has a robustness to noise because it uses a plurality of pieces of ACS information. However, VD-AUTO-SMASH is susceptible to image distortion because it lacks a compensation against image distortion attributable to phase distortion between channels (see Heidemann, R. M., Griswold, M. A., Haase, A. & Jakob, P. M., 2001. VD-AUTO-SMASH Imaging. Magnetic Resonance in Medicine 45(6), 1066-1074).

GRAPPA acquires part of information in the $k_y$-direction in k-space in order to reduce image acquisition time, as in SMASH or VD-AUTO-SMASH method. However, GRAPPA acquires additional information called ACS information, as in VD-AUTO-SMASH method, and then estimates the relationship between the ACS information and acquired line information. Thereafter, information on unacquired lines is estimated along the $k_y$-direction by using the estimated relationship, thereby reconstructing the image (see FIG. 3).

In this case, GRAPPA can improve the quality of image by using the ACS information, as in VD-AUTO-SMASH. GRAPPA has a feature that images of respective channels are separately reconstructed. As a result, the performance of image reconstruction is improved, and image distortion attributable to phase distortion between channels can be eliminated when the images of respective channels are combined together by using a square root of sum of squares (SoS) reconstruction method.

However, GRAPPA requires a relatively long image reconstruction time when the number of channels is large since individual channel images are separately constructed, and bears disadvantage due to the inability to acquire the phase information of a final image when an image is reconstructed using the SoS method (see Griswold, M. A., Jakob, P. M., Heidemann, R. M., Nittka, M., Jellus, V., Wang, J., et al., 2002. Generalized Auto-calibrating Partially Parallel Acquisitions GRAPPA. Magnetic Resonance in Medicine, 47(6), 1202-1210).

Multi-Column Multi-Line GRAPPA is an improvement on the above-described GRAPPA, and is referred to as "2D-GRAPPA." Existing GRAPPA uses only information in the $k_y$-direction to reconstruct a missing line information. In contrast, 2D-GRAPPA additionally uses information in the $k_x$-direction, as illustrated in FIG. 4, thereby improving the performance of image reconstruction. It is generally referred to as "2D-GRAPPA" because of its feature for reconstructing an image by using both information in the $k_x$-direction and information in the $k_y$-direction in k-space.

However, 2D-GRAPPA also requires separate reconstructions of images acquired for respective channels, like existing GRAPPA, inheriting the inability to acquire the phase information of a final image when the SoS method is used in combining the pieces of information of the respective channels (see Wang, Z., Wang, J. & Detre, J. A., 2005. Improved Data Reconstruction Method for GRAPPA. Magnetic Resonance in Medicine, 54(3), 738-742).

The "method and device for magnetic resonance imaging on the basis of a partially parallel acquisition" is a technology that is disclosed by U.S. Patent Application Publication No. 2009/0134870 A1. The image reconstruction process of the technology will now be briefly described. First, low-frequency images are generated by using low-frequency signals fully sampled from a plurality of pieces of image information acquired from respective channels. The low-frequency images of the respective channels are combined into a single sheet of combined image, the single combined image is subjected to inverse Fourier transform, and then image reconstruction is performed, as in GRAPPA. Using this process, the US patent application has the advantage of reducing image reconstruction time. Furthermore, the method can acquire both the magnitude and phase information of an image because a single image is reconstructed.

However, the performance according to the US patent application is variable depending on the method of combining individual channel images, and requires the process of acquiring or estimating a sensitivity map because it is essential to such method as an Adaptive Combine (see Vladimir Jellus, 2009. Method and Device for Magnetic Resonance Imaging on the basis of a Partially Parallel Acquisition (PPA), US Patent Application Publication No. 2009/0134870 A1).

SUMMARY

In accordance with some embodiments, the present disclosure provides a method for a parallel image reconstruction, which method comprises (a) acquiring image information by channel via parallel coils in a magnetic resonance imaging (MRI) scanner; (b) extracting low-frequency signals from the image information; (c) reconstructing low-frequency images from the low-frequency signals; (d) generating filter banks; and (f) reconstructing a final image by using the filter banks, wherein the generating of the filter banks comprises separately generating low-frequency image information for the reconstruction of magnitude information and low-frequency image information for the reconstruction of phase information by using the low-frequency signal, and then separately generating filter banks for reconstruction of the magnitude information and filter banks for reconstruction of the phase information.

The image information may comprise k-space information per channel acquired through sub-sampling and additionally acquired auto-calibrating signal (ACS) information.

The image information by channel may be defined by the following equation:

$$S_j^{Acq}(k_x, k_y) = \begin{cases} S_j(k_x, k_y), & \text{if } -\frac{N_L}{2} \leq k_y < \frac{N_L}{2} \text{ or } k_y = \text{multiples of } R \\ 0, & \text{otherwise} \end{cases}$$

where $S_j$ is unsubsampled original image information of a j-th channel and is defined in a range of $-N_{ro}/2 \leq k_x < N_{ro}/2$ and $-N_{pe}/2 \leq k_y < N_{pe}/2$ (where $N_{ro}$ is a resolution in a frequency encoding direction ($k_x$), and $N_{pe}$ is a resolution in a phase encoding direction ($k_y$), $N_L$ is a low-frequency resolution in the $k_y$-direction fully sampled from the image information by channel, and R is an acceleration factor (AF) value.

The extracting of the low-frequency signals may be defined by the following equation:

$$S_j^L(k_x, k_y) = S_j^{Acq}(k_x, k_y), \text{ for } -\frac{N_L}{2} \leq k_y < \frac{N_L}{2}$$

where $S_j^{Acq}$ is the image information per channel, and $N_L$ is a low-frequency resolution in a $k_y$-direction fully sampled from the image information per channel.

The reconstructing of the low-frequency images is performed by transforming the low-frequency signals to image domain (e.g. inverse Fourier transform).

The low-frequency image information for reconstruction of magnitude information may be represented by the following equation:

$$S_{C,M}^L(k_x, k_y) = \mathcal{F}\left\{\sum_{j=1}^{N_C}\{\mathcal{F}^{-1}(S_j^L(k_x, k_y)) \times \exp(i\phi_j^{var})\}\right\}$$

$$\phi_j^{var} = L(\mathcal{F}^{-1}(W(S_j^L(k_x, k_y))))$$

where $S_j^L$ is the low-frequency signals, $N_C$ is the number of channels, and $W$ is a window.

The low-frequency image information for the reconstruction of phase information may be represented by the following equation:

$$S_{C,P}^L(k_x, k_y) = \mathcal{F}\left\{\left(\sum_{j=1}^{N_C}|\mathcal{F}^{-1}(S_j^L(k_x, k_y))|\right) \times \exp\left(-iL\left(\sum_{j=1}^{N_C}(\mathcal{F}^{-1}(S_j^L(k_x, k_y)))\right)\right)\right\}$$

where $S_j^L$ is the low-frequency signals, and $N_C$ is the number of channels.

The reconstructing of the final image may comprise: generating two images by using the filter for reconstruction of the magnitude information and the filter for reconstruction of the phase information; extracting the magnitude information and the phase information from the two images, respectively; and combining extracted magnitude and extracted phase information into a single image.

The filter for reconstruction of the magnitude information and the filter for reconstruction of the phase information may be defined by the following equations:

$$H_M^r(i_x, i_y, j) = \underset{H}{\arg\min}\left\|\begin{array}{c}S_{C,M}^L(k_x, k_y) - \\ \sum_{j=1}^{N_C}\sum_{i_y=-N_d}^{N_u}\sum_{i_x=-N_l}^{N_r} H_M^r(i_x, i_y, j) \times \\ S_j^L(k_x - i_x, k_y + r - R \cdot i_y)\end{array}\right\|_F^2 + \lambda^2\|L(H_M^r, S_{C,M}^L)\|_2^2$$

$$H_P^r(i_x, i_y, j) = \underset{H}{\arg\min}\left\|\begin{array}{c}S_{C,P}^L - \sum_{j=1}^{N_C}\sum_{i_y=-N_d}^{N_u}\sum_{i_x=-N_l}^{N_r} H_P^r(i_x, i_y, j) \times \\ S_j^L(k_x - i_x, k_y + r - R \cdot i_y)\end{array}\right\|_F^2 + \lambda^2\|L(H_P^r, S_{C,P}^L)\|_2^2$$

for $r = 0, \ldots, R-1$, $-\frac{N_{ro}}{2} \leq k_x < \frac{N_{ro}}{2}$, $-\frac{N_L}{2} \leq k_x < \frac{N_L}{2}$ where $H_M^r$ is the filter for reconstruction of the magnitude information based on each value $r$, $H_P^r$ is the filter for reconstruction of the phase information based on the value $r$, $S_j^L$ is the low-frequency signals, $L$ is a function that is representative of a magnitude of a signal of an aliasing part of images that are reconstructed using the filters $H_M^r$ and $H_P^r$ and the low-frequency signals $N_{ro}$ is a resolution in a frequency encoding direction ($k_y$), $N_L$ is a low-frequency resolution in a phase encoding direction ($k_y$) fully sampled from image information acquired from a j-th channel, $N_C$ is the number of channels, and R is an AF value.

The reconstructing of the final image may comprise generating the final image having both the magnitude information and the phase information by performing an inverse Fourier transform on image information $\hat{S}_M$ and $\hat{S}_P$ in k-space that are reconstructed by the following equations:

$$\hat{S}_M(k_x, k_y) = \sum_{j=1}^{N_C}\sum_{i_y=-N_d}^{N_u}\sum_{i_x=-N_l}^{N_r} H_M^r(i_x, i_y, j) \times S_j^{Acq}(k_x - i_x, k_y - r - R \cdot i_y),$$

$$\hat{S}_P(k_x, k_y) = \sum_{j=1}^{N_C}\sum_{i_y=-N_d}^{N_u}\sum_{i_x=-N_l}^{N_r} H_P^r(i_x, i_y, j) \times S_j^{Acq}(k_x - i_x, k_y - r - R \cdot i_y),$$

for $r = 0, \ldots, R-1$ and $k = $ (multiples of R)$+r$, where $H_M^r$ is the filter for reconstruction of the magnitude information based on each value $r$, $H_P^r$ is the filter for reconstruction of the phase information based on the value $r$, $S_j^{Acq}$ is the image information per channel, $N_C$ is the number of channels, and R is an AF value.

Figure 1:
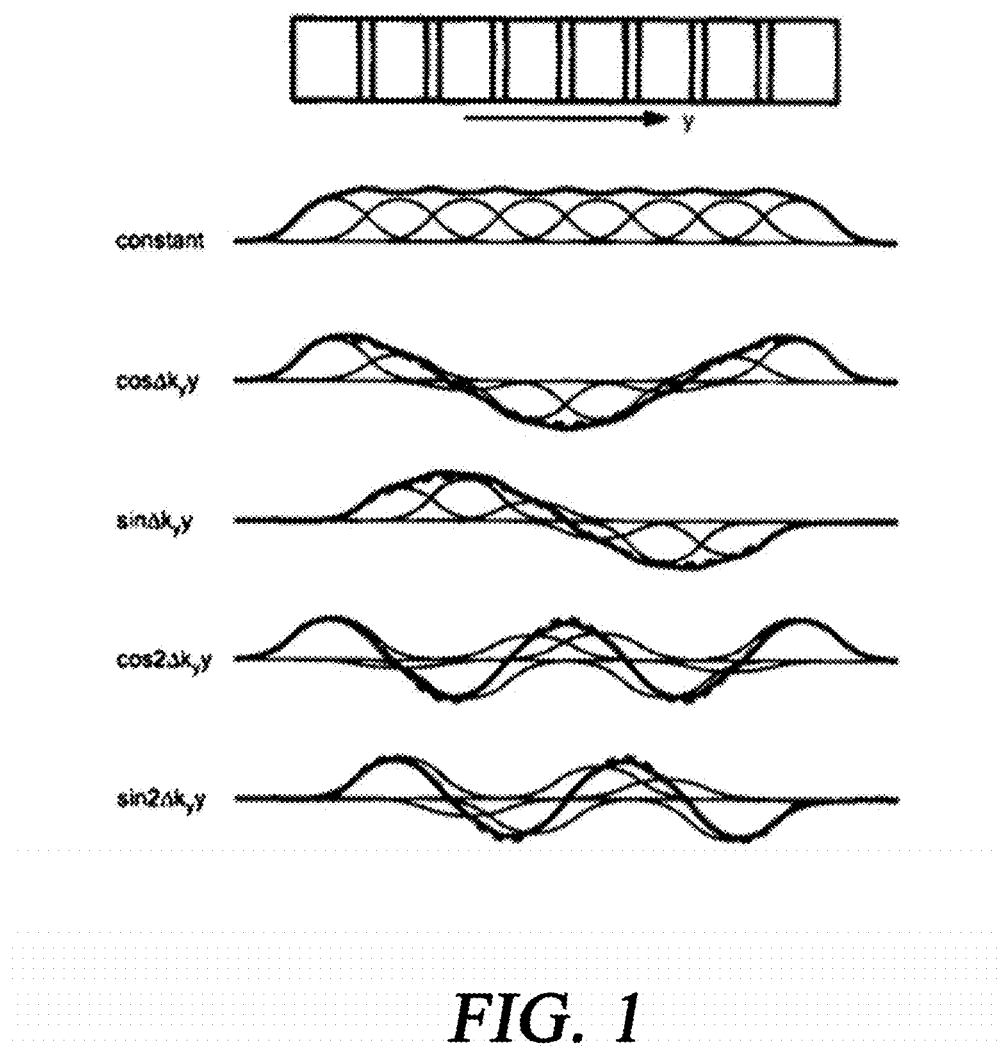
FIG. 1 is a diagram of conventional SMASH.
Figure 2:
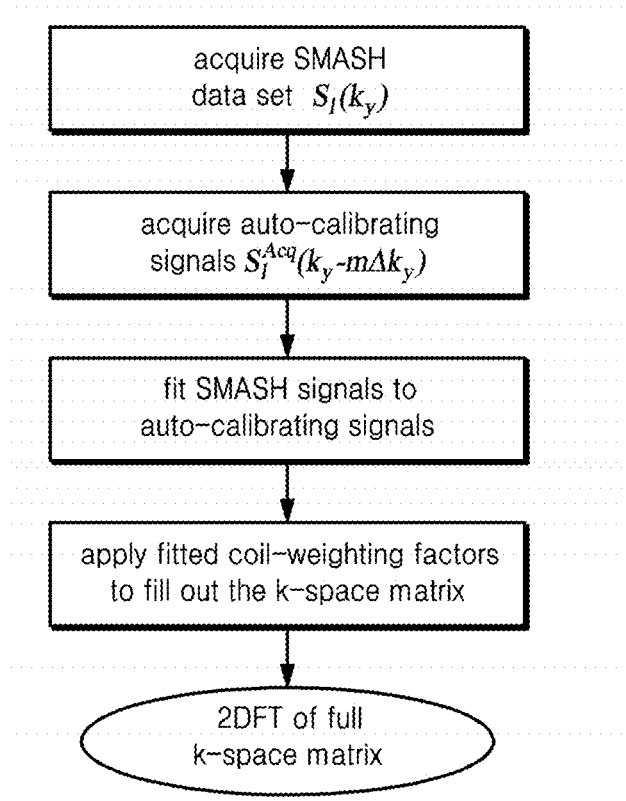
FIG. 2 is a diagram of conventional VD-AUTO-SMASH.
Figure 3:
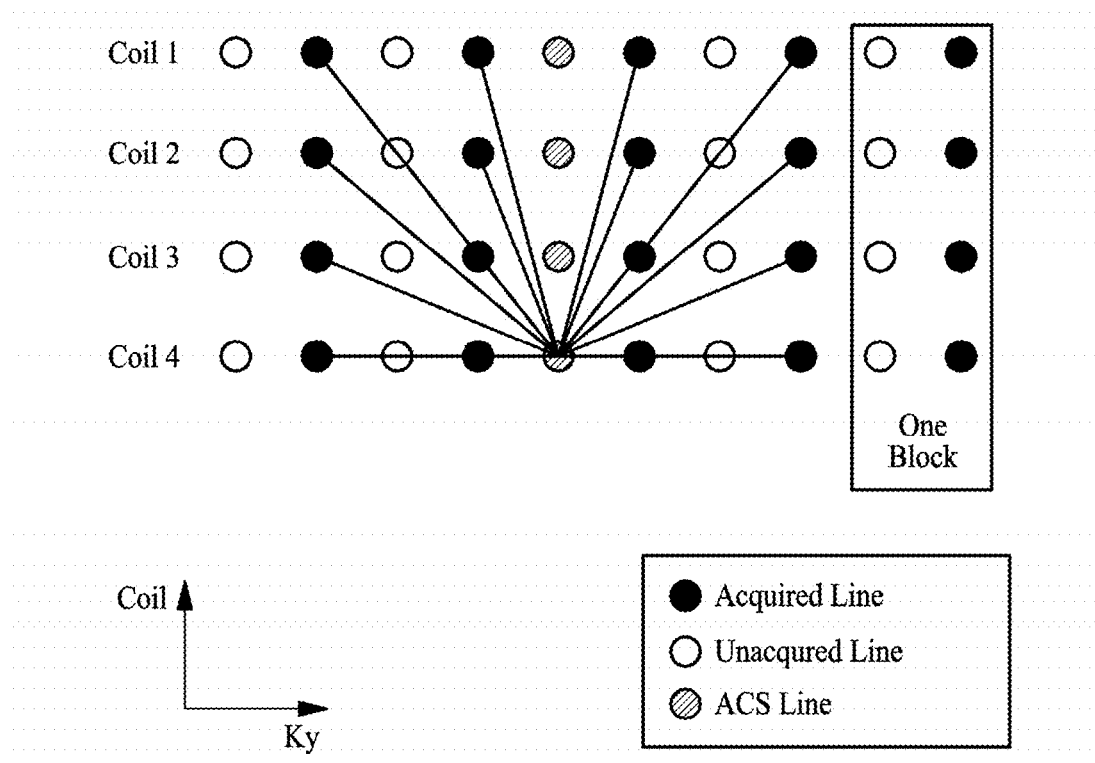
FIG. 3 is a diagram of conventional GRAPPA.
Figure 4:
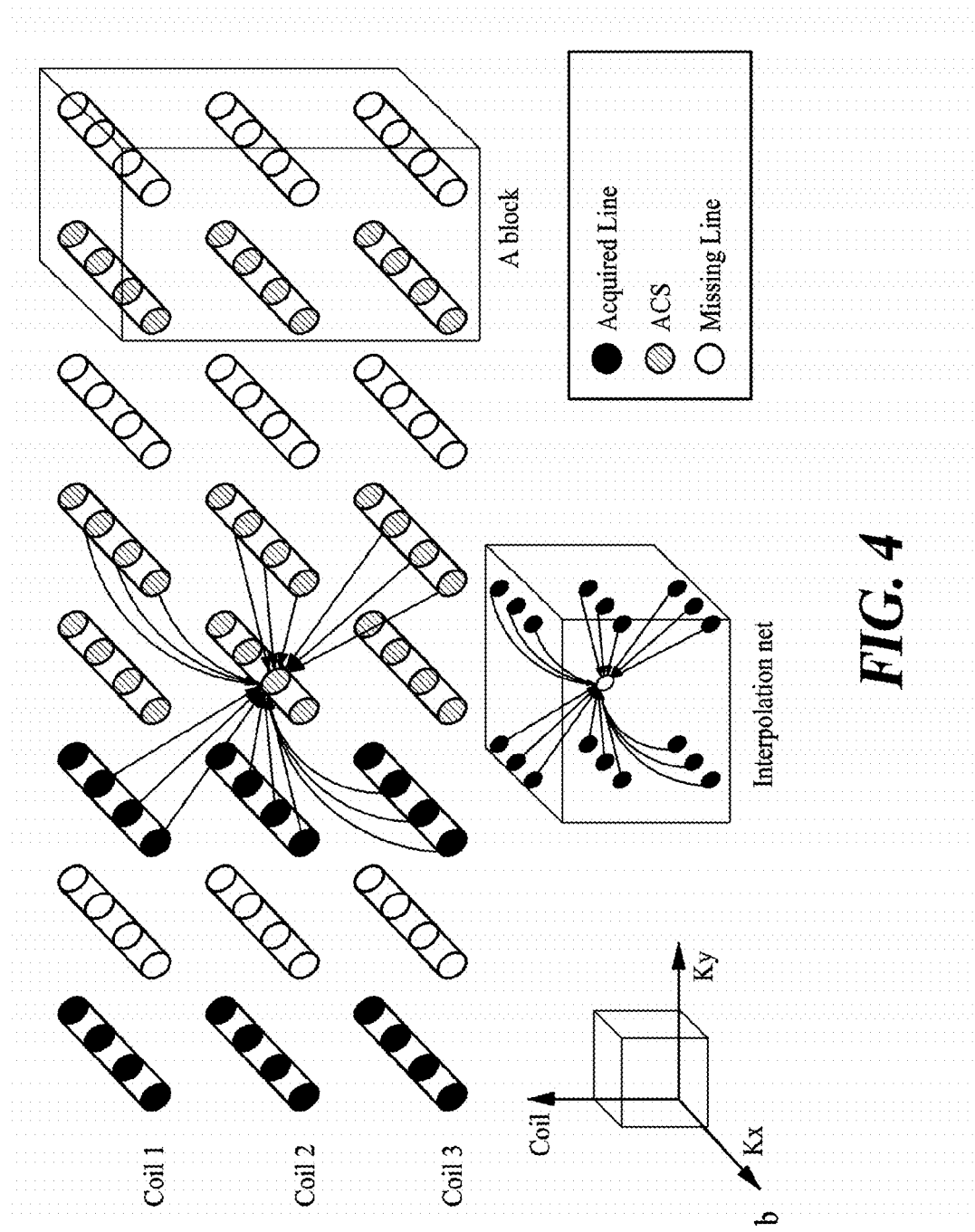
FIG. 4 is a diagram of conventional 2D-GRAPPA.

GLOSSARY $\rho(x, y)$: Original Image
$\hat{\rho}(x, y)$: Final Image
$C(x, y)$: sensitivity profile
H: 2D Synthesis Filter Bank
R: Acceleration Factor (AF)
$S_j^{Acq}$: Image Data Acquired from j-th Channel
$S_j^L$: Low-frequency Signals

DETAILED DESCRIPTION

At least one embodiment of the present disclosure provides a parallel image reconstruction method that does not require a sensitivity map and can reduce image reconstruction time when the number of channels is large.

Hereinafter, at least one embodiment of the present disclosure will be described in detail with reference to the accompanying drawings.

In the following description, like reference numerals designate like elements, although the elements are shown in different drawings. Further, in the following description of at least one embodiment, a detailed description of known functions and configurations incorporated herein will be omitted for the purpose of clarity and for brevity.

Additionally, in describing the components of the present disclosure, terms like first, second, A, B, (a), and (b) are used. These are solely for the purpose of differentiating one component from another, and one of ordinary skill would understand the terms are not to imply or suggest the substances, the order or sequence of the components. If a component is described as 'connected', 'coupled', or 'linked' to another component, one of ordinary skill in the art would understand the components are not necessarily directly 'connected', 'coupled', or 'linked' but also are indirectly 'connected', 'coupled', or 'linked' via a third component.

Figure 5:
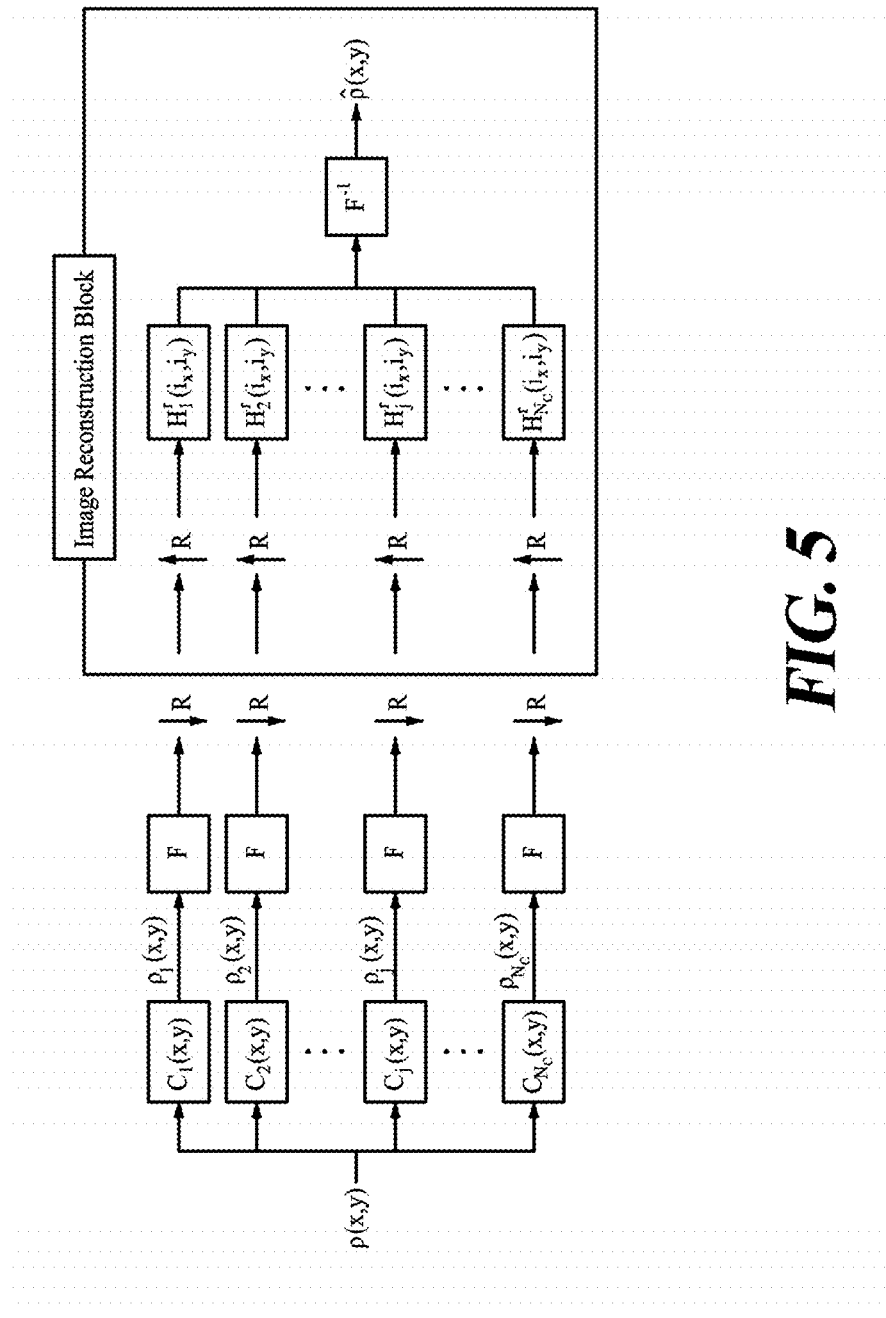
FIG. 5 is a diagram of an algorithm of a parallel image reconstruction method according to at least one embodiment of the present disclosure.

FIG. 5 is a diagram of an algorithm of a parallel image reconstruction method according to at least one embodiment of the present disclosure.

In FIG. 5, $\rho(x,y)$ is an original image to be acquired, and $C_j(x,y)$ is the sensitivity profile of a j-th coil in image space. In this case, j is a number in a range of $1 \leq j \leq N_C$, and $N_C$ is the total number of channels. $\rho_j(x,y)$ is image information acquired by each coil. In the parallel image reconstruction method, $\rho_j(x,y)$ is sub-sampled in the $k_y$-direction in k-space by an acceleration factor (AF) value R.

The sub-sampled information is up-sampled by R and reconstructed using two-dimensional (2D) synthesis filter banks H, and then a final image is obtained through an inverse Fourier transform. A filter bank for reconstructing the magnitude information of an image and a filter bank for reconstructing the phase information of the image may be separately designed.

The algorithm of the parallel image reconstruction method according to at least one embodiment of the present disclosure illustrated in FIG. 5 is described in detail in the following description on a step by step basis.

Figure 6:
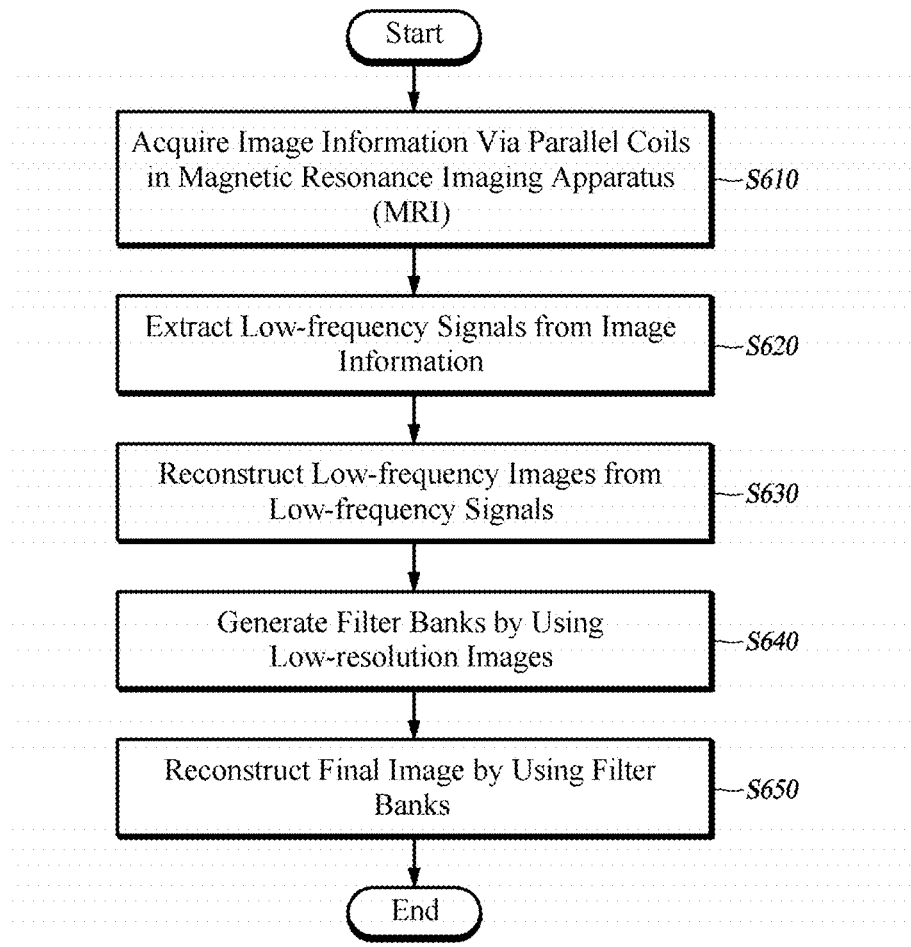
FIG. 6 is a flowchart of the parallel image reconstruction method according to at least one embodiment of the present disclosure.
Figure 7:
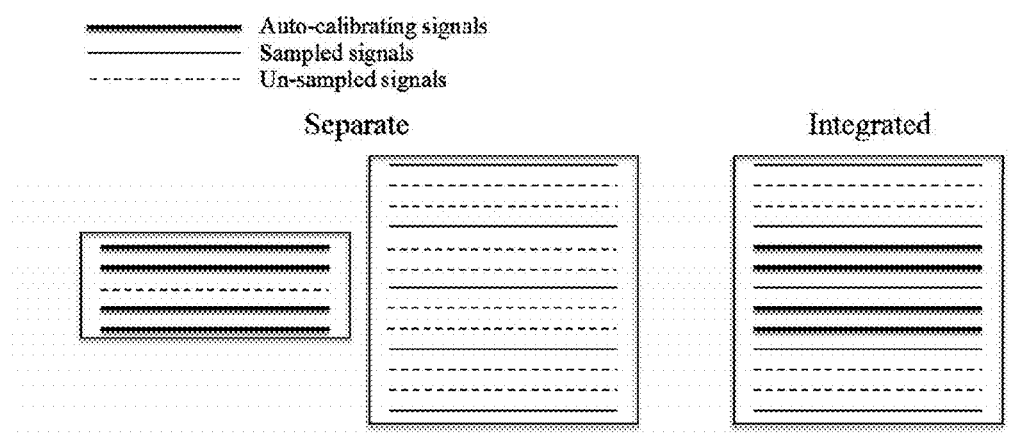
FIG. 7 is a detailed diagram of the step of acquiring image and ACS information in the parallel image reconstruction method according to at least one embodiment of the present disclosure.
Figure 8:
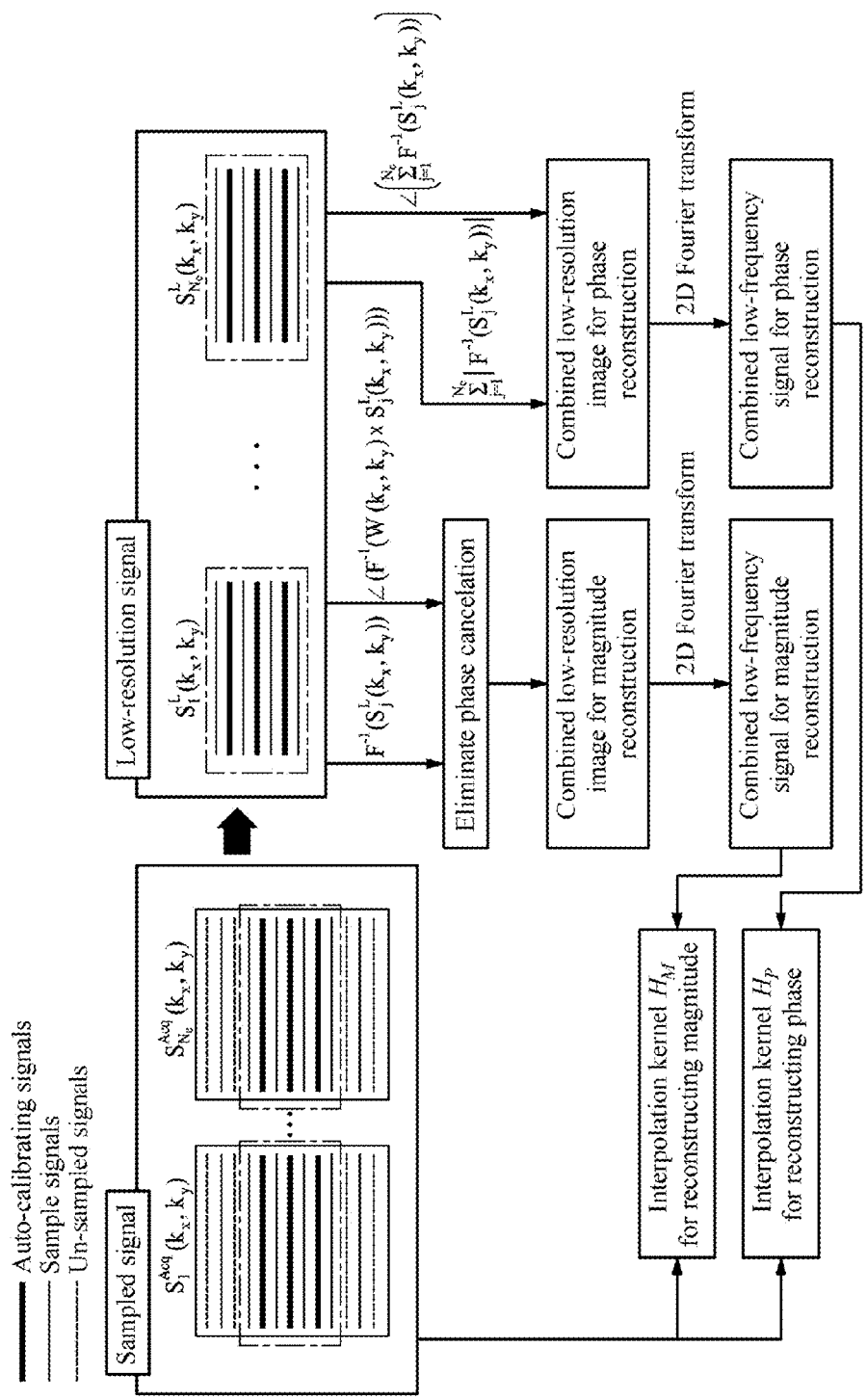
FIG. 8 is a detailed diagram of the step of designing 2D synthesis filter banks in the parallel image reconstruction method according to at least one embodiment of the present disclosure.
Figure 9:
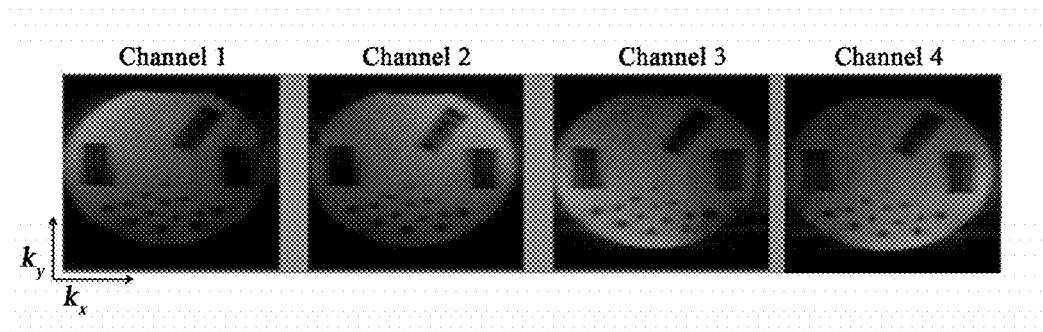
FIG. 9 is a diagram of low-frequency images reconstructed from low-frequency signals in the parallel image reconstruction method according to at least one embodiment of the present disclosure.
Figure 10:
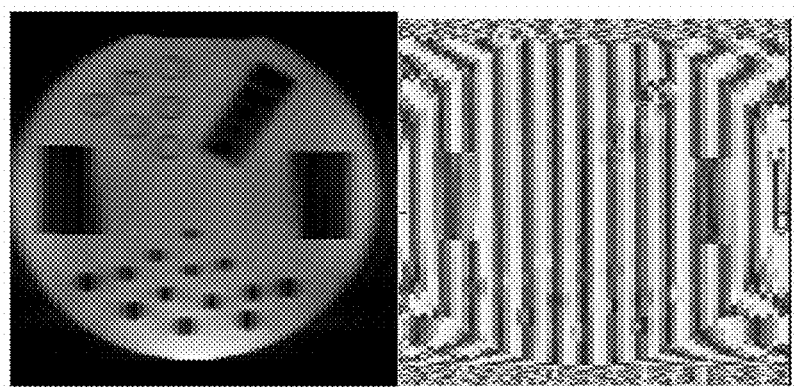
FIG. 10 is a diagram of the magnitude and phase information of an image acquired from the low-frequency images in the parallel image reconstruction method according to at least one embodiment of the present disclosure.
Figure 11:
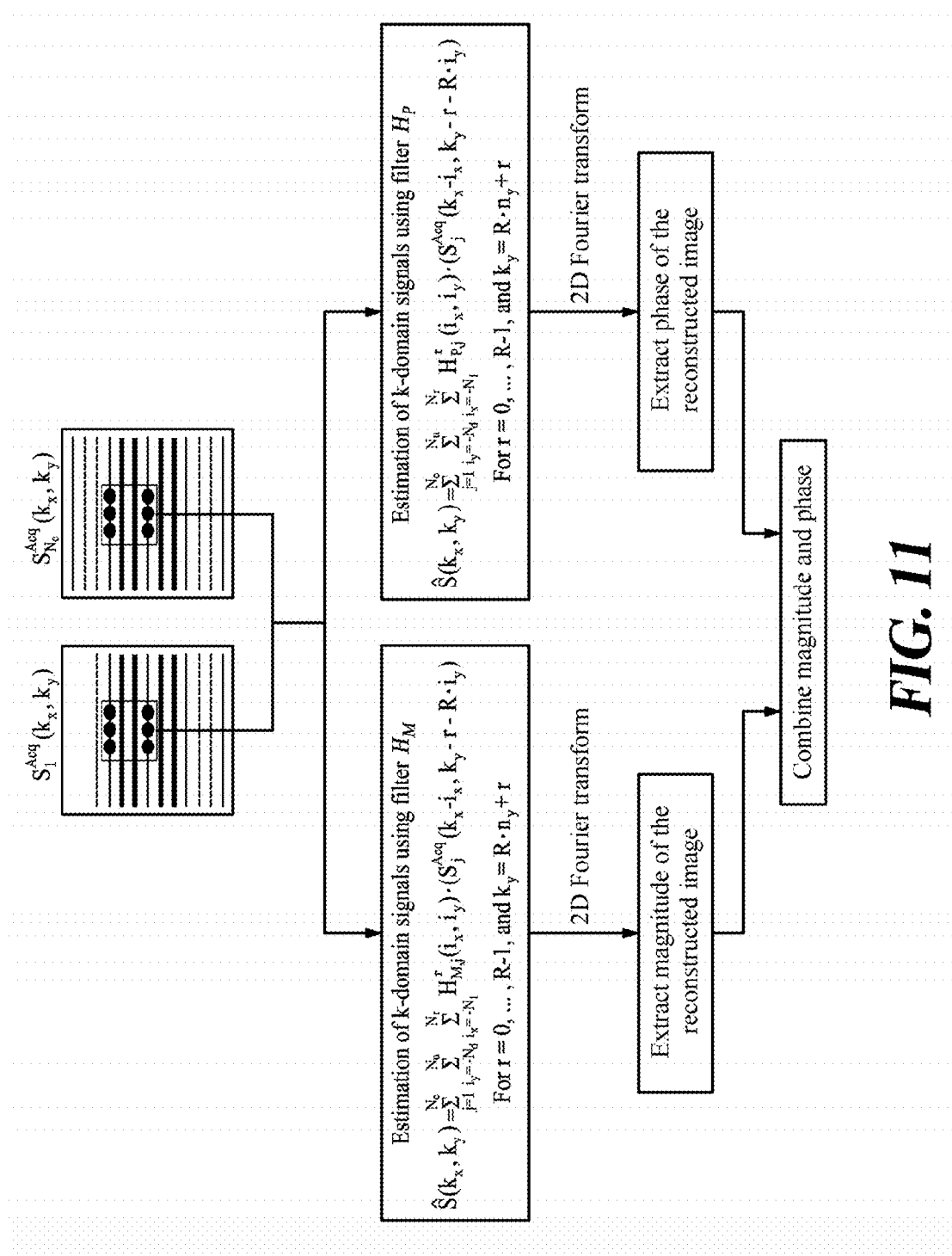
FIG. 11 is a detailed diagram of the step of reconstructing a final image by using the designed 2D synthesis filter banks in the parallel image reconstruction method according to at least one embodiment of the present disclosure.

FIG. 6 is a flowchart of the parallel image reconstruction method according to at least one embodiment of the present disclosure, FIG. 7 is a detailed diagram of the step of acquiring image and ACS information in the parallel image reconstruction method according to at least one embodiment of the present disclosure, FIG. 8 is a detailed diagram of the step of designing 2D synthesis filter banks in the parallel image reconstruction method according to at least one embodiment of the present disclosure, FIG. 9 is a diagram of low-frequency images reconstructed from low-frequency signals in the parallel image reconstruction method according to at least one embodiment of the present disclosure, FIG. 10 is a diagram of the magnitude and phase information of an image acquired from the low-frequency images in the parallel image reconstruction method according to at least one embodiment of the present disclosure, and FIG. 11 is a detailed diagram of the step of reconstructing a final image by using the designed 2D synthesis filter banks in the parallel image reconstruction method according to at least one embodiment of the present disclosure.

Referring to FIGS. 6, 7, 8 and 11 together, the image reconstruction process of the parallel image reconstruction method according to at least one embodiment of the present disclosure will now be described. Since the steps of the parallel image reconstruction method according to at least one embodiment of the present disclosure may be performed concurrently or in different orders, unlike those described in the following description, the order of the steps is not necessarily limited to that described in the following description.

The parallel image reconstruction method according to at least one embodiment of the present disclosure starts with step S610 of acquiring image information by channel via parallel coils in a magnetic resonance imaging (MRI) scanner. Here, the image information includes the k-space information of each channel acquired through sub-sampling and additionally acquired auto-calibrating signal (ACS) information, and image information $S_j^{Acq}$ acquired from a j-th channel is defined by Equation 5:

$$S_j^{Acq}(k_x, k_y) = \begin{cases} S_j(k_x, k_y), & \text{if } -\frac{N_L}{2} \le k_y < \frac{N_L}{2} \text{ or } k_y = \text{multiples of } R \\ 0, & \text{otherwise} \end{cases} \quad \text{Equation 5}$$

In Equation 5, $S_j$ is defined as $-N_{ro}/2 \le k_x < N_{ro}/2$ and $-N_{pe}/2 \le k_y < N_{pe}/2$. Here, $N_{ro}$ is a resolution in the frequency encoding direction ($k_x$), and $N_{pe}$ is a resolution in the phase encoding direction ($k_y$). $S_j$ is the unsubsampled original image information of a j-th channel, and R is an acceleration factor or AF value. $N_L$ is a low-frequency resolution in the $k_y$-direction fully sampled from image information $S_j^{Acq}$ acquired from the j-th channel.

The parallel image reconstruction method according to at least one embodiment of the present disclosure acquires additional image information called ACS information in order to design 2D synthesis filter banks. Methods of acquiring the sub-sampled image information and the ACS information include a separate-type method of separately acquiring the ACS information and the sub-sampled image information and an integrated-type method of acquiring the ACS information and the sub-sampled image information together by adjusting sub-sampling intervals in the $k_y$-direction, as illustrated in FIG. 7.

Thereafter, unsubsampled low-frequency signals $S_j^L$ are extracted from the acquired image information $S_j^{Acq}$ at step S620. The extracted low-frequency signals $S_j^L$ are defined by Equation 6:

$$S_j^L(k_x, k_y) = S_j^{Acq}(k_x, k_y), \text{ for } -\frac{N_L}{2} \le k_y < \frac{N_L}{2} \quad \text{Equation 6}$$

Thereafter, low-frequency images formed of the low-frequency signals are reconstructed by performing an inverse Fourier transform on the low-frequency signals $S_j^L$ at step S630. An example of the reconstructed low-frequency images is illustrated in FIG. 9.

Step S640 is performed for generating filter banks by using the low-frequency images reconstructed at step S630. The filter bank generation process of the parallel image reconstruction method according to at least one embodiment of the present disclosure will be illustrated in detail with FIG. 8.

First, to acquire the magnitude information of the image, a window as described in Equation 7 is applied to the reconstructed low-frequency images of FIG. 9.

$$W(S_j^L(k_x, k_y)) \quad \text{Equation 7}$$

Any type of window capable of extracting information on phase distortion attributable to the coil of each channel may be used as the window W of Equation 7. The phase distortion is compensated by using the extracted phase information, and low-frequency image information for image reconstruction is generated by using the compensated signal. The corresponding step may be represented by Equation 8:

$$S_{C,M}^L(k_x, k_y) = \mathcal{F}\left\{\sum_{j=1}^{N_C} \{\mathcal{F}^{-1}(S_j^L(k_x, k_y)) \times \exp(i\phi_j^{var})\}\right\} \quad \text{Equation 8}$$

$$\phi_j^{var} = \angle(\mathcal{F}^{-1}(W(S_j^L(k_x, k_y))))$$

Thereafter, in the step of generating low-frequency image information required to reconstruct the phase information of the image, magnitude information is extracted from the reconstructed low-frequency images of FIG. 9, and the magnitude information of the image is reconstructed by compensating for the distorted phase information between channels. An example of this step is SoS (Equation 9) or an absolute sum (Equation 10):

$$S_{C,P}^L(k_x, k_y) = \mathcal{F}\left\{\left(\sum_{j=1}^{N_C} |\mathcal{F}^{-1}(S_j^L(k_x, k_y))|\right) \times \exp\left(-i\angle\left(\sum_{j=1}^{N_C}(\mathcal{F}^{-1}(S_j^L(k_x, k_y)))\right)\right)\right\} \quad \text{Equation 9}$$

$$\sum_{j=1}^{N_C} |\mathcal{F}^{-1}(S_j^L(k_x, k_y))| \quad \text{Equation 10}$$

In this case, the corresponding results include only the magnitude information of the image. The phase information of the image is acquired by computing the complex sum of the low-frequency images of respective channels, as indicated by Equation 11.

$$\angle\left(\sum_{j=1}^{N_C} \mathcal{F}^{-1}(S_j^L(k_x, k_y))\right) \quad \text{Equation 11}$$

The results of the magnitude and phase information of the image are illustrated in FIG. 10.

A single complex image is generated with the results of the absolute sum (Equation 10) being the magnitude information of the image and the results of the complex sum (Equation 11) being the phase information of the image, and is then subjected to a Fourier transform, as indicated in Equation 12, thereby generating ACS information that has been compensated for image distortion attributable to interference between channels.

$$S_{C,P}^L(k_x, k_y) = \mathcal{F}\left\{\left(\sum_{j=1}^{N_C} |\mathcal{F}^{-1}(S_j^L(k_x, k_y))|\right) \times \exp\left(-i\angle\left(\sum_{j=1}^{N_C}(\mathcal{F}^{-1}(S_j^L(k_x, k_y)))\right)\right)\right\} \quad \text{Equation 12}$$

In Equation 12, $S_j^L$ is a low-frequency signal, $N_C$ is the number of channels, and W is a window.

Thereafter, filters required for image reconstruction are designed using the low-frequency image information. Filter $H_M$ for reconstructing magnitude information and filter $H_P$ for reconstructing phase information are generated using two types of low-frequency image information obtained as the results. Filter $H_M$ for reconstructing magnitude information and filter $H_P$ for reconstructing phase information are defined with respect to AF value R, as represented by Equation 13.

$$H_M^r(i_x, i_y, j) = \operatorname*{argmin}_H \left\| S_{C,M}^L(k_x, k_y) - \sum_{j=1}^{N_C} \sum_{i_y=-N_d}^{N_u} \sum_{i_x=-N_l}^{N_r} H_M^r(i_x, i_y, j) \times S_j^L(k_x - i_x, k_y + r - R \cdot i_y) \right\|_F^2 + \lambda^2 \|L(H_M^r, S_{C,M}^L)\|_2^2$$

$$H_P^r(i_x, i_y, j) = \operatorname*{argmin}_H \left\| S_{C,P}^L - \sum_{j=1}^{N_C} \sum_{i_y=-N_d}^{N_u} \sum_{i_x=-N_l}^{N_r} H_P^r(i_x, i_y, j) \times S_j^L(k_x - i_x, k_y + r - R \cdot i_y) \right\|_F^2 + \lambda^2 \|L(H_P^r, S_{C,P}^L)\|_2^2$$

for $r = 0, \ldots, R-1$, $-\frac{N_{ro}}{2} \le k_x < \frac{N_{ro}}{2}$, $-\frac{N_L}{2} \le k_x < \frac{N_L}{2}$ Equation 13

In Equation 13, $H_M^r$ is a filter for the reconstruction of the magnitude information based on each value r, $H_P^r$ is a filter for the reconstruction of the phase information based on value r, and the sizes of the filters are in the range from $-N_d$ to $N_u$ in the $k_y$-direction and in the range from $-N_l$ to $N_r$ in the $k_x$-direction. Here, L is a function that is indicative of the magnitude of the signal of the aliasing part of images that are reconstructed using designed filters $H_M^r$ and $H_P^r$ and low-frequency image information $S_j^L$. In this case, the filters may be generated via a regularization process with λ set to a value equal to or larger than 0 or via a pseudo-inverse process with λ set to 0.

Step S650 for reconstructing a final image by using the filters generated at step S640 may be expressed by Equation 14. In this equation, $\hat{S}$ is reconstructed information in k-space. Here, image reconstruction for reconstructing the magnitude information of the image and image reconstruction for reconstructing the phase information of the image are performed in separate ways (see $\hat{S}_M$ and $\hat{S}_P$), which is illustrated in FIG. 11.

$$\hat{S}_M(k_x, k_y) = \sum_{j=1}^{N_C} \sum_{i_y=-N_d}^{N_u} \sum_{i_x=-N_l}^{N_r} H_M^r(i_x, i_y, j) \times S_j^{Acq}(k_x - i_x, k_y - r - R \cdot i_y),$$

$$\hat{S}_P(k_x, k_y) = \sum_{j=1}^{N_C} \sum_{i_y=-N_d}^{N_u} \sum_{i_x=-N_l}^{N_r} H_P^r(i_x, i_y, j) \times S_j^{Acq}(k_x - i_x, k_y - r - R \cdot i_y),$$

for $r = 0, \ldots, R-1$, and $k_y$ = (multiples of R) + r,

Equation 14

Finally, final image $\hat{\rho}$ having both magnitude information and phase information is generated by performing an inverse Fourier transform on reconstructed image information $\hat{S}_M$ and $\hat{S}_P$ in k-space. In the parallel image reconstruction method according to at least one embodiment of the present disclosure, a final image having both magnitude information and phase information is generated by adding the reconstructed magnitude information of the image of the image and the reconstructed phase information of the image together.

The parallel image reconstruction method according to at least one embodiment of the present invention outputs a single image into which a plurality of pieces of image information acquired from respective channels have been combined as the output of the filter banks, unlike conventional parallel image reconstruction methods, such as GRAPPA and 2D-GRAPPA, thereby reducing image reconstruction time and also eliminating the loss of the magnitude and phase information of the image that occurs when individual channel images are combined. Furthermore, the magnitude and phase information of the image are separately reconstructed, in which case a plurality of pieces of low-frequency image information that have undergone different compensation steps are used for image reconstruction. This leads to the effects of improving the performance of image reconstruction and also obviating the need for a sensitivity map.

Experiment: Simulation

Figure 12:
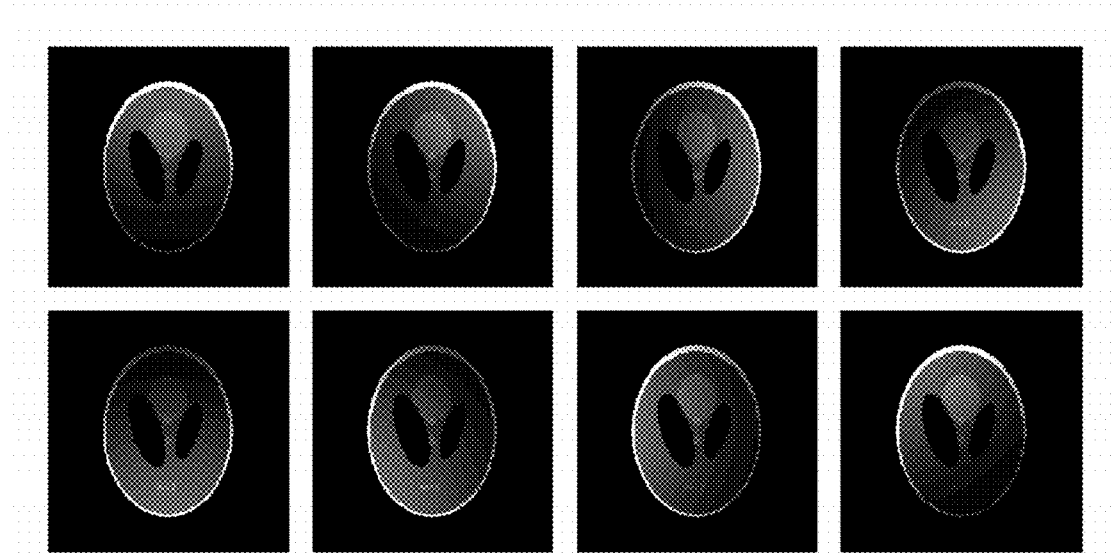
FIG. 12 is a diagram of a total of eight channel images generated using the Shepp-Logan Phantom in an experiment that was conducted using the parallel image reconstruction method according to at least one embodiment of the present disclosure.
Figure 13:
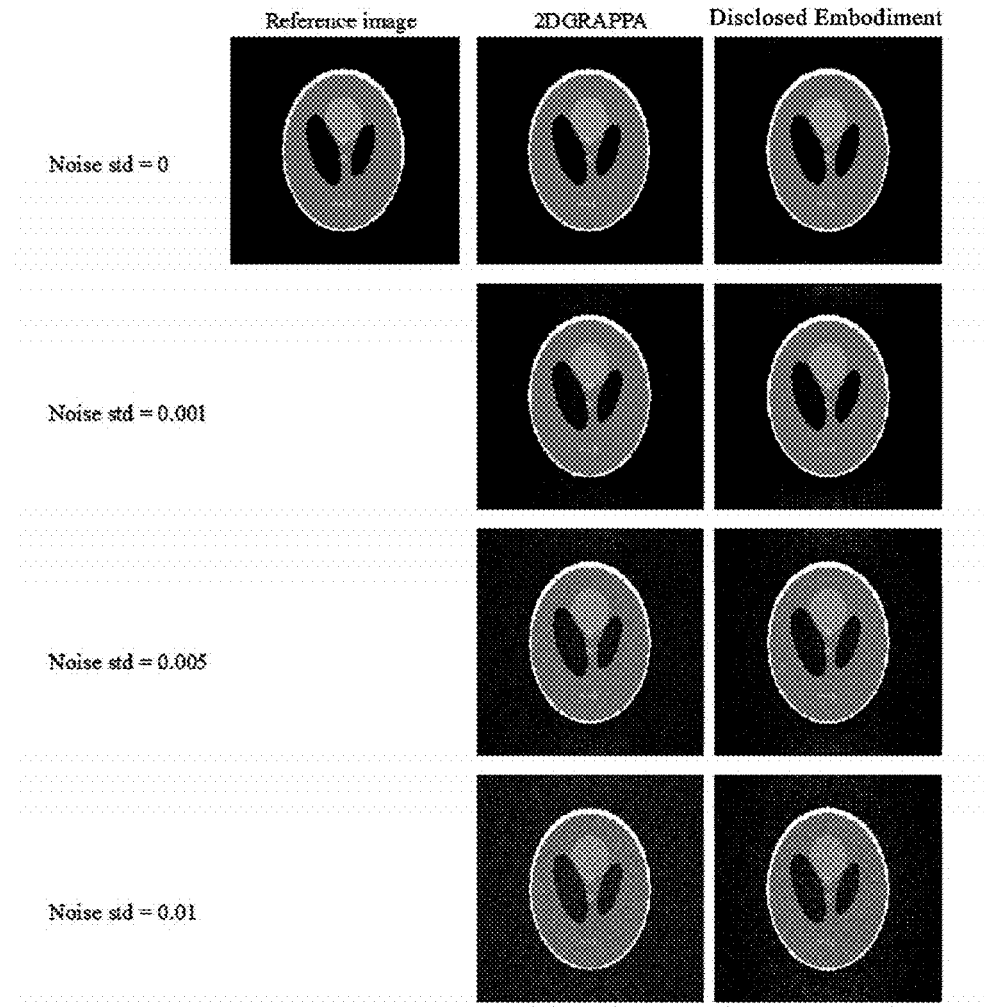
FIG. 13 is a diagram of images reconstructed by the parallel image reconstruction method according to the at least one embodiment of the present disclosure and 2D-GRAPPA in an experiment that was conducted using the parallel image reconstruction method according to at least one embodiment of the present disclosure.

As illustrated in FIG. 12, the performance of the parallel image reconstruction method according to at least one embodiment of the present disclosure and the performance of 2D-GRAPPA were compared using a total of 8-channel images acquired by using the Shepp-Logan Phantom. Throughout the overall reconstruction process, AF value R was 2, and 24 ACS lines were used. Images reconstructed by the respective methods are illustrated in FIG. 13. The image reconstructed by 2D-GRAPPA is the result of combining reconstructed individual channel images via an absolute sum. As illustrated in FIG. 13, the results of the simulation indicate that there are no significant differences between the performance of the parallel image reconstruction method according to at least one embodiment of the present disclosure and the performance of 2D-GRAPPA.

Figure 14:
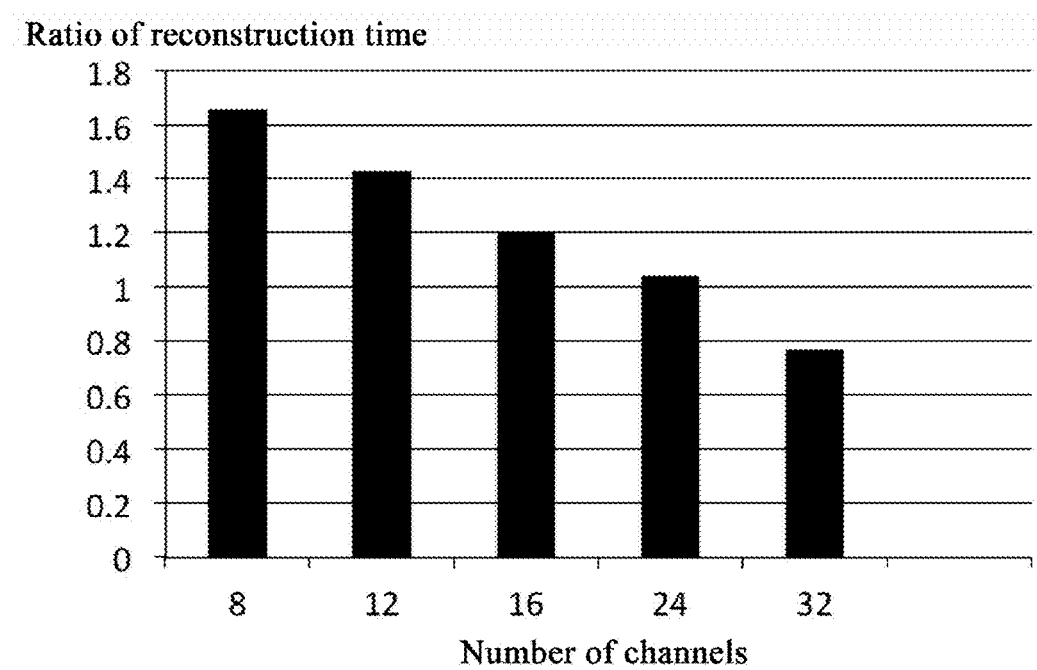
FIG. 14 is a diagram of the results of the comparison between the image reconstruction speed of the parallel image reconstruction method according to at least one embodiment of the present disclosure and the image reconstruction speed of 2D-GRAPPA depending on the number of channels in an experiment that was conducted using the parallel image reconstruction method according to at least one embodiment of the present disclosure.

In the above-described simulation, the results of the comparison as illustrated in FIG. 14 are between the image reconstruction speed of the parallel image reconstruction method according to at least one embodiment of the present disclosure and the image reconstruction speed of 2D-GRAPPA depending on the number of channels. FIG. 14 illustrates the ratio of the reconstruction time of the parallel image reconstruction method according to at least one embodiment of the present disclosure to the reconstruction time of 2D-GRAPPA depending on the number of channels, representing the time ratio of the disclosed parallel image reconstruction/2D-GRAPPA.

The details of an environment in which the simulations were conducted are as follows:

Simulations being implemented by using Matlab
Processor: Intel quad core 2.6 GHz
Memory: 16 GB 1600 MHz DDR3.

From the results illustrated in FIG. 14, it is shown that the parallel image reconstruction method according to at least one embodiment of the present disclosure took a longer image reconstruction time than 2D-GRAPPA for 24 or fewer channels but took a shorter image reconstruction time than 2D-GRAPPA for 32 or more channels.

While 2D-GRAPPA creates all individual channel images, the parallel image reconstruction method according to at least one embodiment of the present disclosure generates a combined image at a time, which results in a saving of time. In particular, as indicated by the above results, the difference in image reconstruction time is high when the number of coils is large. Furthermore, since the corresponding results indicate the time it took to acquire both the magnitude and phase information of the image, the image reconstruction time of the parallel image reconstruction method according to at least one embodiment of the present disclosure is reduced by half when only the magnitude information of the image is acquired. Accordingly, in that case, the temporal advantage is further enhanced.

Experiment: Sphere Phantom Experiment

For verification of the performance by using an image actually acquired via an MRI scanner, the performance of the parallel image reconstruction method according to at least one embodiment of the present disclosure was verified based on an image taken using the Sphere Phantom. When an AF value was 4, an image was reconstructed using a total of 48 ACS lines. The variables that were used to acquire the image are as follows:

Image acquisition method used: Gradient-echo sequence
TR/TE=100/10 ms
Thickness=5 mm
FOV=220 mm$^2$, Matrix size=256×256.

Figure 16:
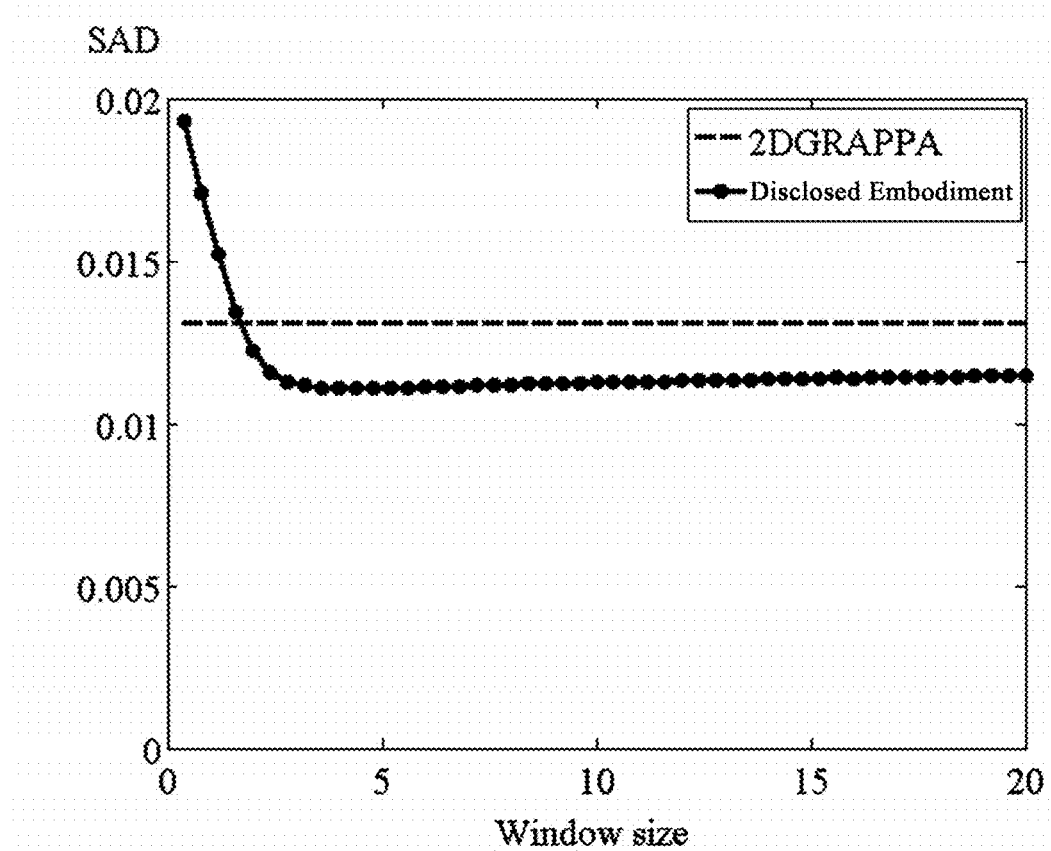
FIG. 16 is a diagram of the reconstruction performance of the parallel image reconstruction method according to at least one embodiment of the present disclosure and the reconstruction performance of 2D-GRAPPA depending on the size of a window in an experiment that was conducted using the parallel image reconstruction method according to at least one embodiment of the present disclosure.

It is shown that the parallel image reconstruction method according to at least one embodiment of the present disclosure reconstructed the magnitude information of an image close to that of an original image similar to 2D-GRAPPA. The reconstruction performance of the parallel image reconstruction method according to at least one embodiment of the present disclosure varies depending on the size of a window used. The results of this experiment were acquired based on the Gaussian window. FIG. 16 illustrates reconstruction performance depending on the size of a window.

Figure 15:
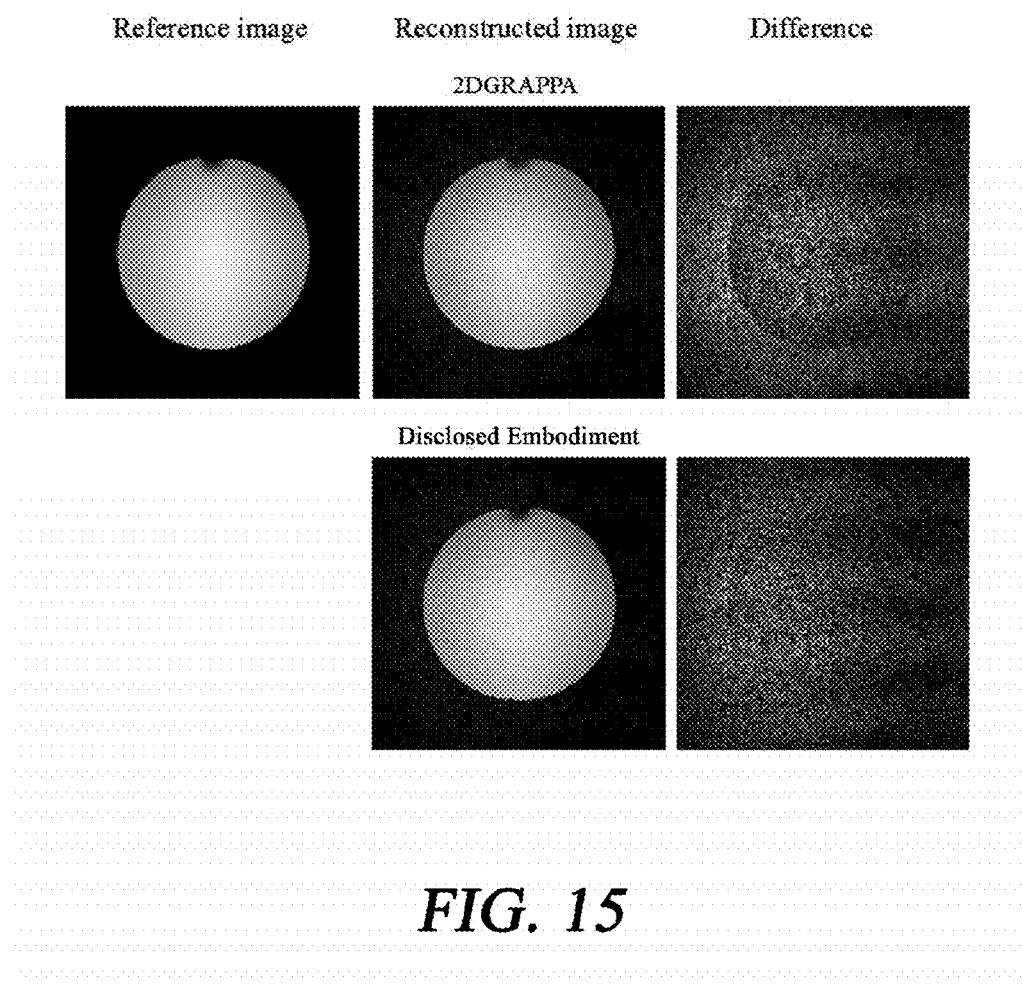
FIG. 15 is a diagram of the results of the comparison between the sum of absolute difference (SAD) values in order to compare the performance of the parallel image reconstruction method according to at least one embodiment of the present disclosure and the performance of 2D-GRAPPA in an experiment that was conducted using the parallel image reconstruction method according to at least one embodiment of the present disclosure.

In the above results, the sum of absolute difference (SAD) values was compared for the comparison of the performances of the parallel image reconstruction method according to at least one embodiment of the present disclosure and of 2D-GRAPPA. From the results of FIG. 15, the parallel image reconstruction method according to at least one embodiment of the present disclosure exhibited fewer differences (SADs) with a reference image than 2D-GRAPPA with respect to a window size equal to or larger than three.

Figure 17:
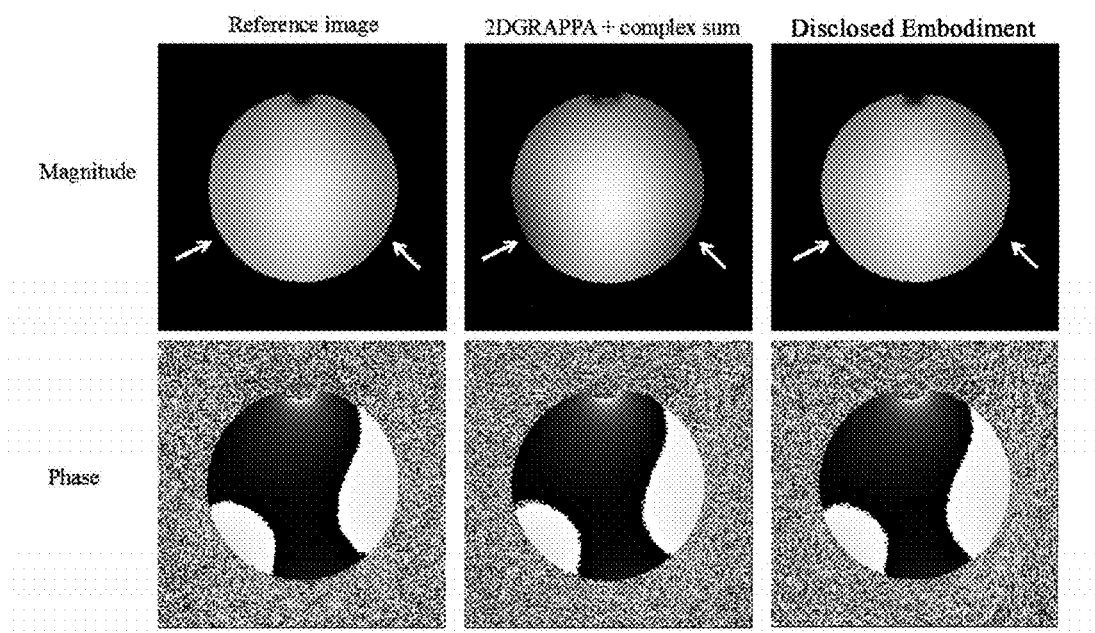
FIG. 17 is a diagram of the loss of image information attributable to phase distortion that occurred when both magnitude and phase information were acquired using the parallel image reconstruction method according to at least one embodiment of the present disclosure and 2D-GRAPPA and also a complex sum was performed on the images of respective channels in 2D-GRAPPA in an experiment that was conducted using the parallel image reconstruction method according to at least one embodiment of the present disclosure.

In case of 2D-GRAPPA, the images of respective channels are combined by using a method, such as a complex sum, in order to acquire phase information. However, this causes a loss of the magnitude information of the image. As illustrated in FIG. 17, the parallel image reconstruction method according to at least one embodiment of the present disclosure acquires both magnitude information and phase information, unlike 2D-GRAPPA, and does not cause the loss of image information attributable to phase distortion that occurs when the complex sum of the images of respective channels is obtained (see the arrows of FIG. 17). Furthermore, referring to the phase information of an original image and reconstruction results acquired by the parallel image reconstruction method according to at least one embodiment of the present disclosure (see the lower portion of FIG. 17), it is shown that the parallel image reconstruction method according to at least one embodiment of the present disclosure can desirably reconstruct the phase information of the original image.

Experiment: In Vivo Experiments

For the verification of the performance of the parallel image reconstruction method according to at least one embodiment of the present disclosure, images of a human brain were obtained using an MRI scanner and the performance was estimated. In a reconstruction process, a total of 48 ACS lines were used for AF=4, as in the Sphere Phantom. The variables that were used to acquire the images are as follows:

TR/TE=500/50 ms
Thickness=5 mm
FOV=256 mm$^2$, Matrix size=256×256.

Figure 18:
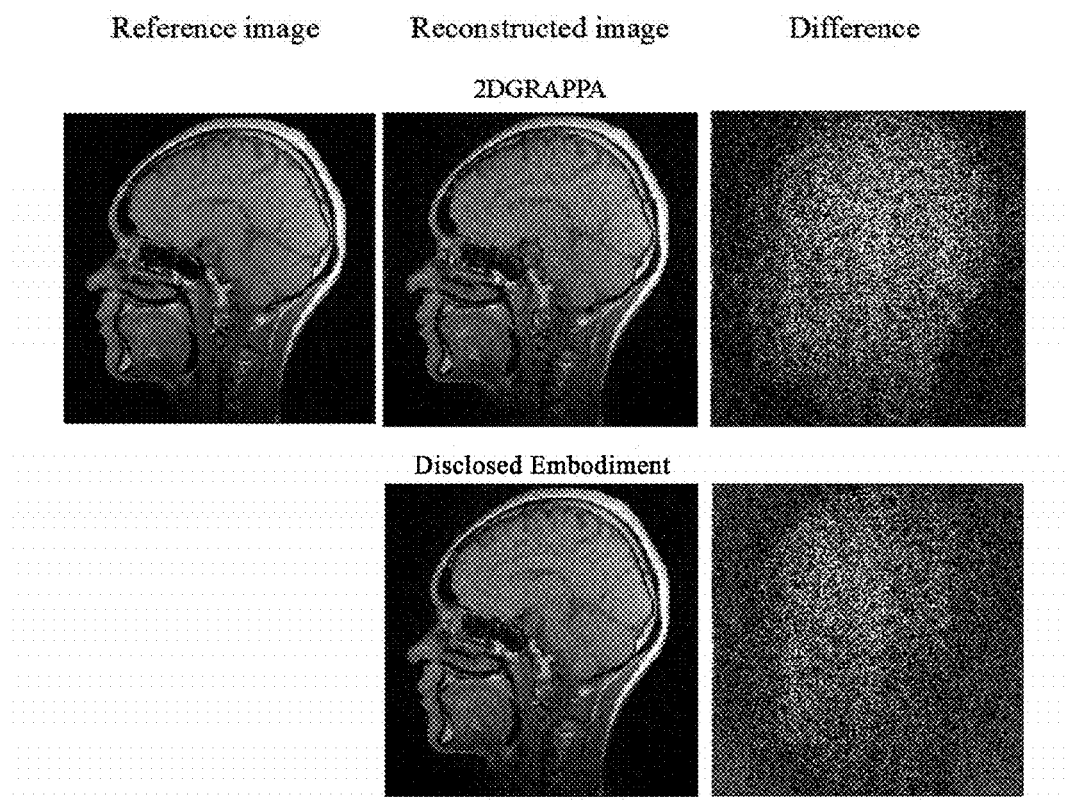
FIG. 18 is a diagram of the results of the verification of performance by using images of the brain of an actual human acquired using an MRI scanner in an in vivo experiment that was conducted using the parallel image reconstruction method according to at least one embodiment of the present disclosure.
Figure 19:
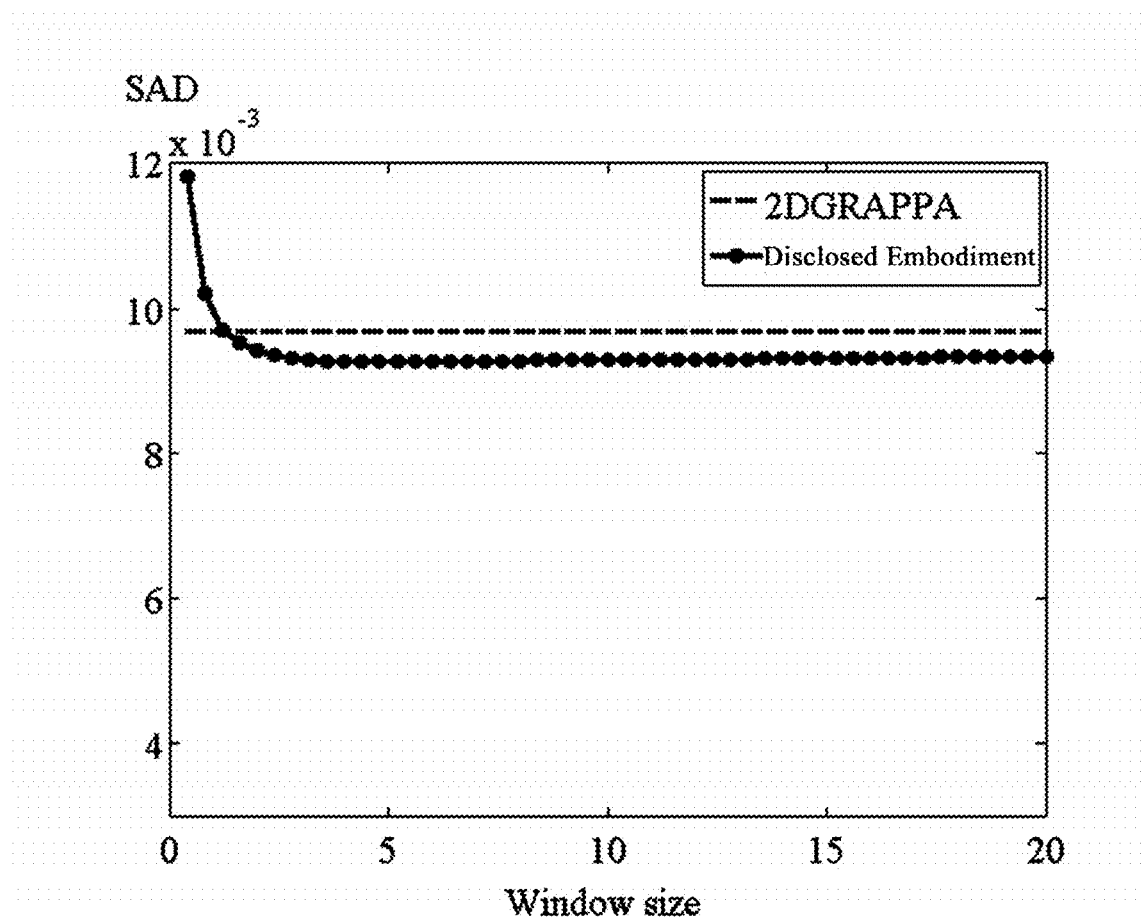
FIG. 19 is a diagram of the results of the comparison between SAD values depending the size of a window in an in vivo experiment that was conducted using the parallel image reconstruction method according to at least one embodiment of the present disclosure.

From FIG. 18, it can be seen that the parallel image reconstruction method according to at least one embodiment of the present disclosure can desirably reconstruct the magnitude information of the image similar to 2D-GRAPPA. In an in vivo experiment, SAD values depending on the size of a window were compared with each other, as in the experiment by using the Sphere Phantom. The results thereof are illustrated in FIG. 19.

From the above results, it is shown that the parallel image reconstruction method according to at least one embodiment of the present disclosure exhibited fewer differences with a reference image than 2D-GRAPPA with respect to a window size larger than or equal to three, as in the experiment by using the Sphere Phantom.

Figure 20:
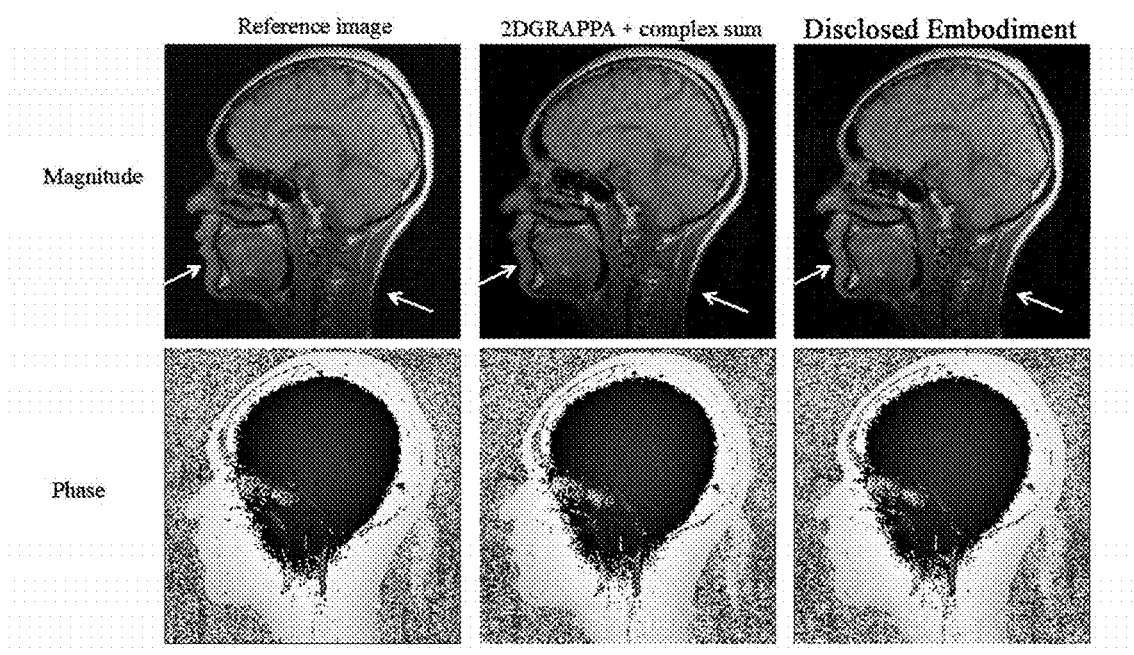
FIG. 20 is a diagram of magnitude and phase information reconstructed in an in vivo experiment that was conducted using the parallel image reconstruction method according to at least one embodiment of the present disclosure.

From the results illustrated in FIG. 20, it is shown that the disclosed parallel image reconstruction method can compensate for image distortion attributable to the distortion of phase information (see the white arrows of FIG. 20) and can desirably acquire the phase information of an image.

The parallel image reconstruction method according to at least one embodiment of the present invention is advantageous in that a single image which combines a plurality of pieces of image information acquired from respective channels is produced as the output of the filter banks, thereby reducing image reconstruction time and also eliminating the loss of the magnitude and phase information of the image that occurs when individual channel images are combined.

Furthermore, the parallel image reconstruction method according to at least one embodiment of the present invention is advantageous in that the magnitude and phase information of the image are separately reconstructed, in which case a plurality of pieces of low-frequency image information that have undergone different compensation processes are used for image reconstruction, thereby improving the performance of image reconstruction and also obviating the need for a sensitivity map.

Although all the elements of at least one embodiment of the present invention have been described as being combined into a single embodiment or as being combined into a single embodiment and then operated, the present invention is not necessarily limited thereto. That is, one or more of all the elements may be selectively combined together and then operated.

Although exemplary embodiments of the present disclosure have been described for illustrative purposes, those skilled in the art will appreciate that various modifications, additions and substitutions are possible, without departing from the various characteristics of the disclosure. Therefore, exemplary embodiments of the present disclosure have been described for the sake of brevity and clarity. Accordingly, one of ordinary skill would understand the scope of the disclosure is not limited by the explicitly described above embodiments but by the claims and equivalents thereof.

What is claimed is:

1. A method for a parallel image reconstruction, comprising:

acquiring image information by channel via parallel coils in a magnetic resonance imaging (MRI) scanner;
extracting low-frequency signals from the image information;

reconstructing low-frequency images from the low-frequency signals;
generating filter banks by using the low-frequency images; and
reconstructing a final image by using the filter banks,
wherein the generating of the filter banks comprises separately generating low-frequency image information for a reconstruction of magnitude information and low-frequency image information for a reconstruction of phase information, and then separately generating filter banks for reconstruction of the magnitude information and filter banks for reconstruction of the phase information.

2. The method of claim 1, wherein the image information comprises k-space information per channel acquired through sub-sampling and additionally acquired auto-calibrating signal (ACS) information.

3. The method of claim 1, wherein the image information by channel is defined by the following equation:

$$S_j^{Acq}(k_x, k_y) = \begin{cases} S_j(k_x, k_y), & \text{if } -\frac{N_L}{2} \leq k_y < \frac{N_L}{2} \text{ or } k_y = \text{multiples of } R \\ 0, & \text{otherwise} \end{cases}$$

where $S_j$ is unsubsampled original image information of a j-th channel and is defined in a range of $-N_{ro}/2 \leq k_x < N_{ro}/2$ and $-N_{pe}/2 \leq k_y < N_{pe}/2$ (where $N_{ro}$ is a resolution in a frequency encoding direction ($k_y$), and $N_{pe}$ is a resolution in a phase encoding direction ($k_y$), $N_L$ is a low-frequency resolution in the $k_y$-direction fully sampled from the image information by channel, and R is an acceleration factor (AF) value.

4. The method of claim 1, wherein the extracting of the low-frequency signals is defined by the following equation:

$$S_j^L(k_x, k_y) = S_j^{Acq}(k_x, k_y), \text{ for } -\frac{N_L}{2} \leq k_y < \frac{N_L}{2}$$

where $S_j^{Acq}$ is the image information per channel, and $N_L$ is a low-frequency resolution in a $k_y$-direction fully sampled from the image information per channel.

5. The method of claim 1, wherein the reconstructing of the low-frequency images is performed by transforming the low-frequency signals to image domain (e.g. inverse Fourier transform).

6. The method of claim 1, wherein the low-frequency image information for reconstruction of magnitude information is represented by the following equation:

$$S_{C,M}^L(k_x, k_y) = \mathcal{F}\left\{\sum_{j=1}^{N_C} |\mathcal{F}^{-1}(S_j^L(k_x, k_y))| \times \exp(i\phi_j^{var})\right\}$$

$$\phi_j^{var} = \angle(\mathcal{F}^{-1}(W(S_j^L(k_x, k_y))))$$

where $S_j^L$ is the low-frequency signals, $N_C$ is the number of channels, and W is a window.

7. The method of claim 1, wherein the low-frequency image information for the reconstruction of phase information is represented by the following equation:

$$S_{C,P}^L(k_x, k_y) = \mathcal{F}\left\{\left(\sum_{j=1}^{N_C} |\mathcal{F}^{-1}(S_j^L(k_x, k_y))|\right) \times \exp\left(-i\angle\left(\sum_{j=1}^{N_C} (\mathcal{F}^{-1}(S_j^L(k_x, k_y)))\right)\right)\right\}$$

where $S_j^L$ is the low-frequency signals, and $N_C$ is the number of channels.

8. The method of claim 1, wherein the reconstructing of the final image comprises:
generating two images by using the filter for reconstruction of the magnitude information and the filter for reconstruction of the phase information;
extracting the magnitude information and the phase information from the two images, respectively; and
combining extracted magnitude and extracted phase information into a single image.

9. The method of claim 1, wherein the filter for reconstruction of the magnitude information and the filter for reconstruction of the phase information are defined by the following equations:

$$H_M^r(i_x, i_y, j) = \underset{H}{\arg\min} \left\| S_{C,M}^L(k_x, k_y) - \sum_{j=1}^{N_C} \sum_{i_y=-N_d}^{N_u} \sum_{i_x=-N_l}^{N_r} H_M^r(i_x, i_y, j) \times S_j^L(k_x - i_x, k_y + r - R \cdot i_y) \right\|_F^2 + \lambda^2 \|L(H_M^r, S_{C,M}^L)\|_2^2$$

$$H_P^r(i_x, i_y, j) = \underset{H}{\arg\min} \left\| S_{C,P}^L - \sum_{j=1}^{N_C} \sum_{i_y=-N_d}^{N_u} \sum_{i_x=-N_l}^{N_r} H_P^r(i_x, i_y, j) \times S_j^L(k_x - i_x, k_y + r - R \cdot i_y) \right\|_F^2 + \lambda^2 \|L(H_P^r, S_{C,P}^L)\|_2^2$$

for $r = 0, \ldots, R-1, -\frac{N_{ro}}{2} \leq k_x < \frac{N_{ro}}{2}, -\frac{N_L}{2} \leq k_x < \frac{N_L}{2}$ where $H_M^r$ is the filter for reconstruction of the magnitude information based on each value r, $H_P^r$ is the filter for reconstruction of the phase information based on the value r, $S_j^L$ is the low-frequency signals, L is a function that is representative of a magnitude of a signal of an aliasing part of images that are reconstructed using the filters $H_M^r$ and $H_P^r$ and the low-frequency signals $S_j^L$, $N_{ro}$ is a resolution in a frequency encoding direction ($k_y$), $N_L$ is a low-frequency resolution in a phase encoding direction ($k_y$) fully sampled from image information acquired from a j-th channel, $N_C$ is the number of channels, and R is an AF value.

10. The method of claim 1, wherein the reconstructing of the final image comprises generating the final image having both the magnitude information and the phase information by performing an inverse Fourier transform on image information $\hat{S}_M$ and $\hat{S}_P$ in k-space that are reconstructed by the following equations:

$$\hat{S}_M(k_x, k_y) = \sum_{j=1}^{N_C} \sum_{i_y=-N_d}^{N_u} \sum_{i_x=-N_l}^{N_r} H_M^r(i_x, i_y, j) \times S_j^{Acq}(k_x - i_x, k_y - r - R \cdot i_y),$$

-continued $$\hat{S}_P(k_x, k_y) = \sum_{j=1}^{N_C} \sum_{i_y=-N_d}^{N_u} \sum_{i_x=-N_l}^{N_r} H_P^r(i_x, i_y, j) \times S_j^{Acq}(k_x - i_x, k_y - r - R \cdot i_y),$$

for r=0, ..., R−1, and $k_y$=(multiples of R)+r,
where $H_M^r$ is the filter for reconstruction of the magnitude information based on each value r, $H_P^r$ is the filter for reconstruction of the phase information based on the value r, $S_j^{Acq}$ is the image information per channel, $N_C$ is the number of channels, and R is an AF value.

* * * * *